United States Patent [19]

Anhalt

[11] 4,159,861

[45] Jul. 3, 1979

[54] ZERO INSERTION FORCE CONNECTOR

[75] Inventor: John W. Anhalt, Orange, Calif.

[73] Assignee: International Telephone and Telegraph Corporation, New York, N.Y.

[21] Appl. No.: 866,031

[22] Filed: Dec. 30, 1977

[51] Int. Cl.[2] .......................... H01R 13/62; H05K 1/12

[52] U.S. Cl. .............................. 339/75 MP; 339/176; 339/176 MP

[58] Field of Search ................ 339/176, 74 R, 75 MP, 339/176 MP; 361/399, 413, 415

[56] References Cited

U.S. PATENT DOCUMENTS

| | | | |
|---|---|---|---|
| 3,744,005 | 7/1973 | Sitzler | 339/75 MP |
| 3,982,807 | 9/1976 | Anhalt et al. | 339/176 MP X |
| 4,054,742 | 10/1977 | Bonhomme | 361/413 X |
| 4,076,362 | 2/1978 | Ichimura | 339/176 MP X |

FOREIGN PATENT DOCUMENTS

| | | | |
|---|---|---|---|
| 2305095 | 10/1976 | Fed. Rep. of Germany | 339/75 MP |

*Primary Examiner*—Roy Lake
*Assistant Examiner*—E. F. Desmond
*Attorney, Agent, or Firm*—Thomas L. Peterson

[57] ABSTRACT

An electrical connector in which two rows of resilient contacts are mounted in a connector housing on opposite sides of a slot which is adapted to receive a printed circuit board or similar electrical component therein. The end portion of the spring contacting section of each contact is reversely bent in a direction away from the slot. A vertically movable contact shifting element is disposed between the spring contacting sections and the reversely bent end portions of the contacts in each row of contacts. A cam actuator is operated to move the contact shifting elements upwardly against the reverse bent end portions of the contacts thereby deflecting the spring contacting sections away from the slot so that a printed circuit board may be inserted therein with zero insertion force. Means is also disclosed for providing a wiping action between the contacts and the traces on the printed circuit board when the contacts are actuated to engage the board. The contacts are frictionally retained in the connector housing, and are provided with upwardly facing shoulders which allows a tool to be inserted through the slot in the housing to engage the contacts directly to press-fit the contacts into holes in a substrate underlying the housing. The contacts and connector housing are designed so that the contacts may be individually removed from the top of the housing.

21 Claims, 10 Drawing Figures

FIG. 3
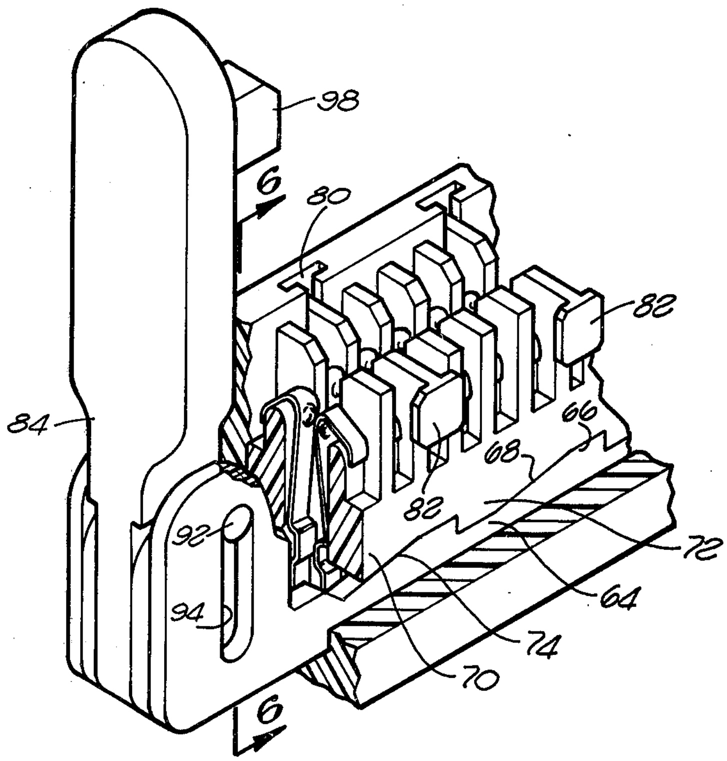
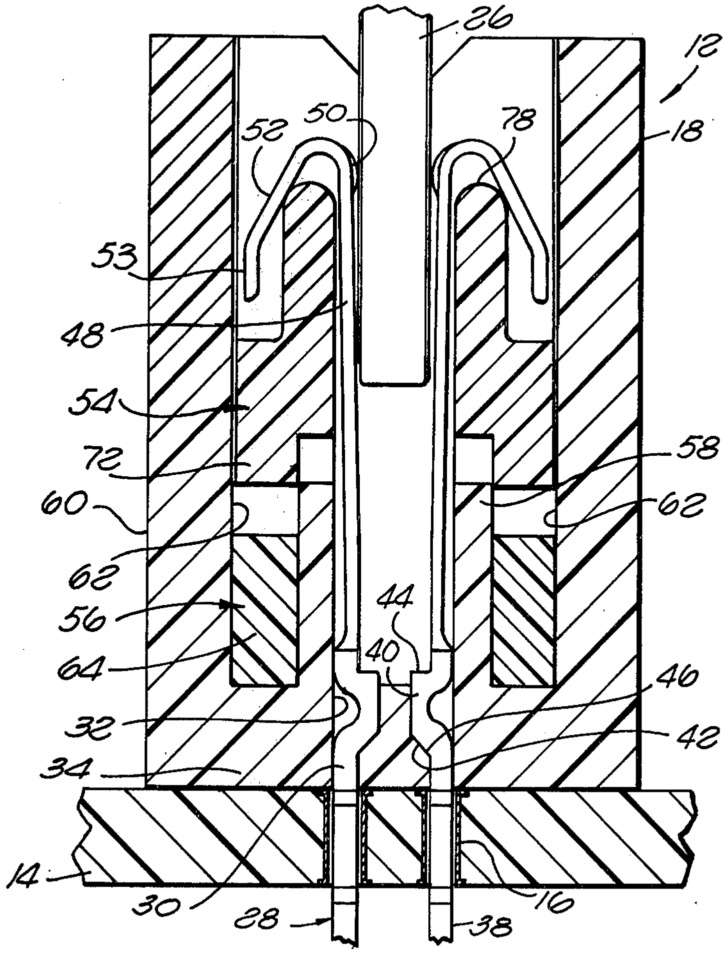
FIG. 4

ZERO INSERTION FORCE CONNECTOR

BACKGROUND OF THE INVENTION

This invention relates generally to an electrical connector and, more particularly, to a zero insertion force electrical connector having cam means therein for actuating the contacts out of engagement with conductors on an electrical component.

It is well known in the art that substantial force is required to insert a printed circuit board into a connector having a large number of spring contacts therein due to the resilient engaging force of the contacts with the edge of the board. As the number of contacts is increased in a connector, the amount of force required to insert the printed circuit board into the connector, or to withdraw it from the connector, may become excessive for practical use. In addition, direct insertion of boards into connectors having spring contacts therein results in a wiping action occurring between the contacts and the conductive traces on the edge of the board, which may cause excessive wear of the traces over lengthy periods of use of the connector. It is, therefore, a common practice in the art to provide a zero insertion force printed circuit board connector in which the contacts are mounted out of the path of movement of the board when it is inserted into the connector whereby no resistance is encountered upon inserting the board thereinto.

There are two general types of zero insertion force connectors, one in which the contacts are normally closed and the other in which the contacts are normally open. In the case of a connector having normally open contacts, the contacts are normally unloaded (that is, no stresses are applied to the contacts) and the contacts are cammed against the printed circuit board. In a connector having normally closed contacts, the contacts are preloaded in the connector housing in a position to resiliently engage a printed circuit board mounted therein and a cam actuator is provided for retracting the contacts away from the standard engagement position so that a board may be inserted into the housing with zero insertion force. The present invention relates to a zero insertion force connector having normally closed contacts.

U.S. Pat. Nos. 3,899,234 and 3,963,317 disclose normally closed contact-type zero insertion force printed circuit board connectors in which the cam actuating mechanism for retracting the two rows of contacts in each connector is disposed between the two rows. This arrangement has the disadvantage that it necessarily requires that the two rows of contacts be spaced apart a greater distance than would otherwise be required if the actuator were not employed.

U.S. Pat. Nos. 3,537,063 and 3,818,419 also disclose normally closed contact-type zero insertion force printed circuit board connectors, but in these connectors the cam actuators are not disposed between the two rows of contacts therein thus permitting a closer spacing between the two rows of contacts in the connectors. However, the cam actuating mechanism in U.S. Pat. No. 3,537,063 comprises two rotatable cam shafts which act independently and are subject to high torsional forces which does not permit uniform actuation of the contacts. The connector disclosed in U.S. Pat. No. 3,818,419 has the disadvantage that the cam actuating mechanism moves laterally thereby necessitating a relatively wide connector housing. Another prior connector of interest is disclosed in U.S. Pat. No. 4,050,758, assigned to the assignee of the present application.

It is therefore one object of the present invention to provide an improved normally closed contact-type zero insertion force printed circuit board connector in which the cam actuating means is disposed outside the two rows of contacts in the connector housing to allow close spacing of the rows of contacts, and also which is relatively simple, compact, and provides uniform actuation of the contacts.

Normally closed zero insertion force printed circuit board connectors have very little wiping action between the contacts and the boards mounted therein when mated and actuated and, therefore, reliable electrical contact is not always achieved. Any contact wiping which results in normally caused by contact surface irregularities which is random in nature or by unintentional shifts in the housing/contact relationships due to unbalanced stresses. It is therefore another object of the present invention to provide a zero insertion force printed circuit board connector which will effect sufficient wiping action between the contacts and the traces on the printed circuit board to provide reliable electrical contact therebetween.

SUMMARY OF THE INVENTION

According to the principal aspect of the present invention, there is provided a zero insertion force electrical connector comprising an elongated insulative housing having a row of contacts therein. The housing has an opening to the top for receiving therein conductors on electrical component, such as a printed circuit board having conductive traces on the edge of the board. Each contact has a mounting portion and a spring contacting portion which extends upwardly from the mounting portion at an angle in one direction toward a vertical plane passing through the opening in the housing. An arm on the spring contacting portion of each contact extends downwardly at an angle in a direction away from said vertical plane. Means is provided for retracting the contacting portions of the contacts away from the vertical plane. The retracting means includes contact shifting means and cam actuator means. The contacting shifting means is disposed between the spring contacting portions and the downwardly extending arms on the contacts. The contacting shifting means is movable vertically between a lower position and an upper position, and embodies cam surface means which engage the arms on the contacts for retracting the contacting portions of the contacts away from the vertical plane when the contacting shifting means is moved from its lower position to its upper position. The cam actuator means is operable to move the contact shifting means from the lower position to the upper position to open the contacts so that a printed circuit board may be inserted into the housing with zero insertion force. If the connector employs two rows of contacts, two contact shifting members are disposed on opposite sides of the rows so that the rows of contacts may be closely spaced together. Furthermore, the aforementioned means for retracting the contacts is relatively simple, compact, and produces a uniform actuation of the contacts.

According to another aspect of the present invention, there is provided a zero insertion force electrical connector, which may be of the type described above, wherein means is provided for effecting longitudinal movement of a printed circuit board in the slot in the connector housing upon actuation of the contacts to produce a wiping action between the contacts and the traces on the board.

BRIEF DESCRIPTION OF THE DRAWINGS

FIG. 3 is a perspective view of one end of the connector illustrated in FIG. 2 showing the actuating handle in its upper position in which the contacts are closed, with a portion of the connector housing broken away to show details of its interior structure;

FIG. 4 is a vertical sectional view similar to FIG. 2 but showing the contacts in their actuated, open position;

DESCRIPTION OF THE PREFERRED EMBODIMENTS

Figure 1:
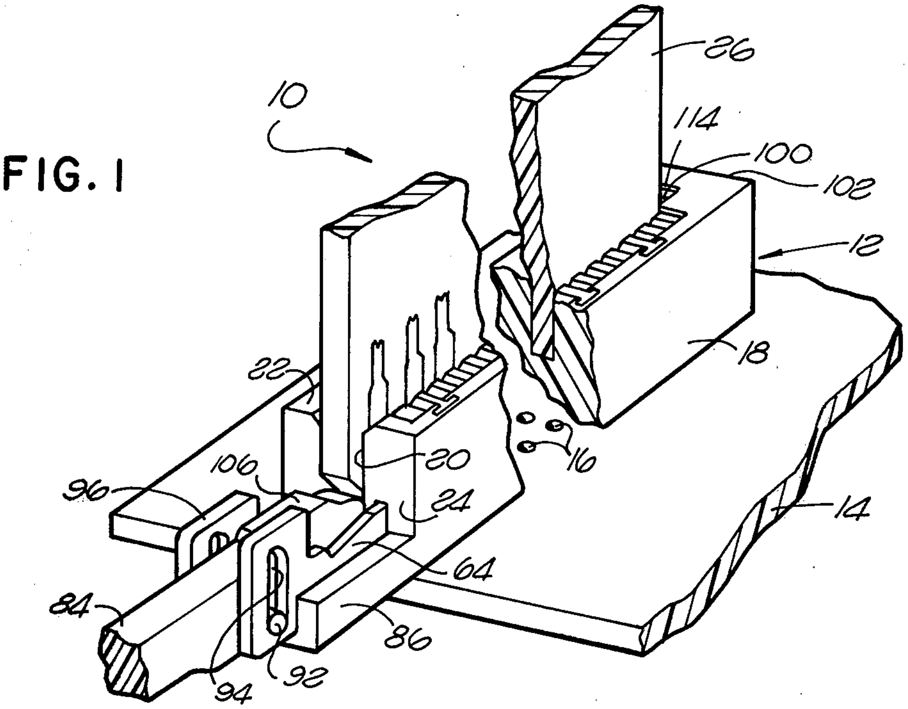
FIG. 1 is a perspective view of an electrical connector assembly embodying the novel connector of the present invention with a printed circuit board inserted therein and the actuating handle of the connector shown in its lower position.

Referring now to FIG. 1 of the drawings in detail, there is illustrated an electrical connector assembly in accordance with the present invention, generally designated 10. Basically, the connector assembly comprises a zero insertion force printed circuit board connector, generally designated 12, which is mounted on an insulative planar substrate 14, which may be a printed circuit board having two rows of plated-through holes 16 therein. The connector 12 comprises an elongated insulative housing 18 having a slot 20 therein which opens to the front or top 22 of the housing as well as at the one end 24 thereof. A printed circuit board 26 is shown mounted in the slot.

Figure 2:
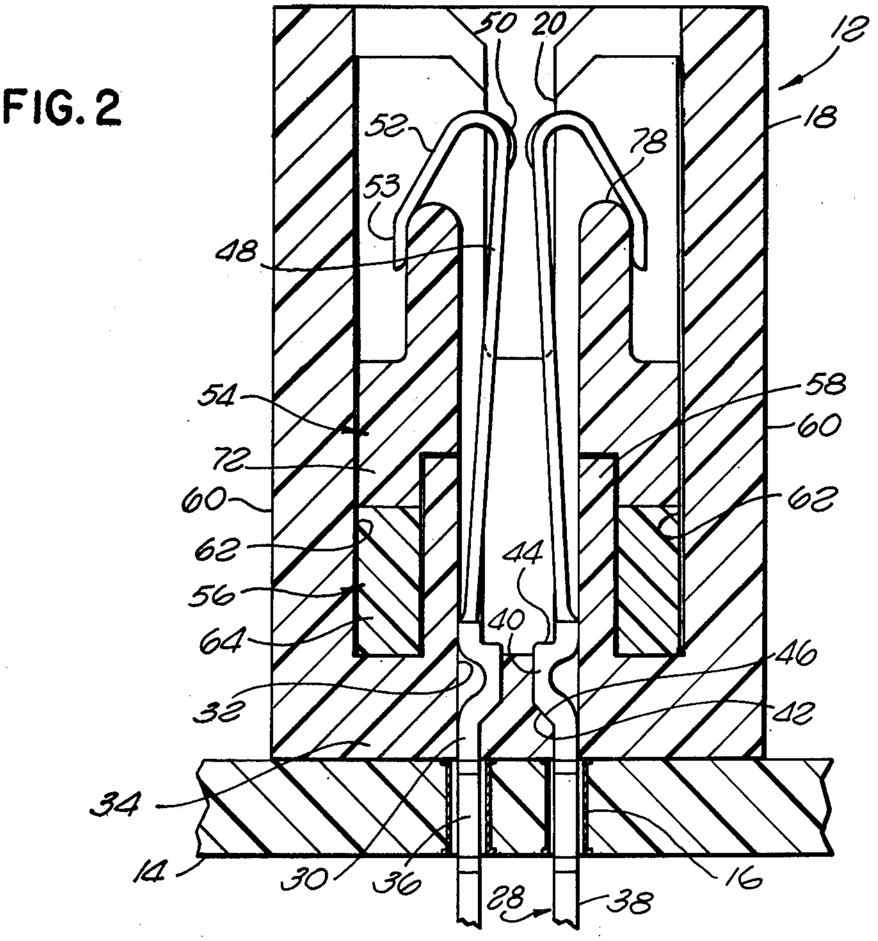
FIG. 2 is a vertical sectional view of the electrical connector assembly illustrated in FIG. 1 in which the contacts are shown in their normal unactuated, closed position.

As seen in FIG. 2, two rows of contacts 28 are mounted in the connector housing 18 on opposite sides of a vertical plane which passes through the center of the printed circuit board receiving slot 20. Each contact has an upper mounting portion 30 which is frictionally mounted in an aperture 32 in the lower wall 34 of the connector housing and a lower mounting portion 36 which is press-fit into a plated-through hole 16 in the substrate 14. A wire-wrap tail or post 38 extends downwardly from the lower mounting portion of the contact. The section 40 of the contact immediately above the upper mounting portion 30 is off-set inwardly toward the center of the connector housing to provide an inclined downwardly facing shoulder 42 and a horizontally extending upwardly facing shoulder 44 which is located slightly above the upper surface of the lower wall 34. The downwardly facing shoulder 42 of the contact engages an upwardly facing tapered shoulder 46 on the lower wall.

Each contact embodies a spring contacting portion 48 which extends upwardly from the off-set section 40 at an angle toward the vertical plane which passes through the slot 20 in the connector housing. A rounded protuberance 50 is provided the inner surface of the upper end of the contacting portion 48 which is adapted to engage a trace on a printed circuit board inserted into the slot 20. The upper end portion of the spring contacting portion of the contact is reversely bent to provide an arm 52 which extends downwardly at an angle away from the vertical plane passing through the slot 20. Each arm terminates in a vertically extending end section 53. As seen in FIG. 2, the contacting portions of the contacts in the two rows of contacts in the connector housing are located in their normally closed, unactuated position. Means is provided for retracting the contacting portions of the contacts away from a vertical plane passing through the slot 20. Such means comprises contact shifting means, generally designated 54, and cam actuator means, generally designated 56.

A pair of upstanding short inner walls 58 are formed on the lower wall 34 of the connector housing on opposite sides of the two rows of contacts. The walls 58 are spaced from the outer walls 60 of the housing to provide a pair of elongated narrow slots 62. The cam actuator means 56 comprises a pair of elongated elements 64 which are longitudinally slidable in the slots 62 in the housing. Upwardly extending tooth-like projections 66 are spaced longitudinally on the upper surface of each cam actuator element 64. Each projection 66 provides an upwardly facing inclined ramp 68 as seen in FIG. 3.

The cam shifting means 54 comprises a pair of elongated vertically movable members 70 having downwardly extending tooth-like projections 72 thereon complementary to the projections 66, and providing downwardly facing inclined ramps 74 which engage the ramps 68. Each member 70 embodies a narrow upwardly extending portion 76 which extends lengthwise below the arms 52 of the contacts and inside the vertical end sections 53 of the arms. An arcuate cam surface 78 is formed on the upper end of the narrow portion 76 of each cam shifting member 70. As seen in FIG. 2, when the contacts are in their normally closed, unactuated position, the arcuate cam surfaces 78 on the cam shifting members 70 are positioned immediately below the angular portions of the arms 52 of the contacts.

In order to actuate the contacts, the cam actuator elements are shifted longitudinally toward the end 24 of the connector housing whereby the inclined ramps 68 and 74 on the elements 64 and 70, respectively, cooperate to raise the contact shifting members 70 upwardly. As the members 70 move upwardly, the arcuate cam surfaces 68 on the upper ends of the members 70 cooperate with the angular arms 52 on the contacts causing the contacting portions of the contacts to be shifted away from a vertical plane passing through the slot 20 in the connector housing as seen in FIG. 4, whereby the contacts are then located in an open position which will allow the printed circuit board 26 to be mounted through the slot 20 into the connector housing between the two rows of contacts with zero insertion force. A plurality of vertically extending T-shaped slots 80 are formed in the sidewalls 60 of the connector housing opening to the interior thereof. These slots slidably receive T elements 82 formed on the outside of the cam shifting members 70 to provide a uniform, controlled, vertical movement of the members 70 in the connector housing upon longitudinal movement of the cam actuator elements 64.

Figure 6:
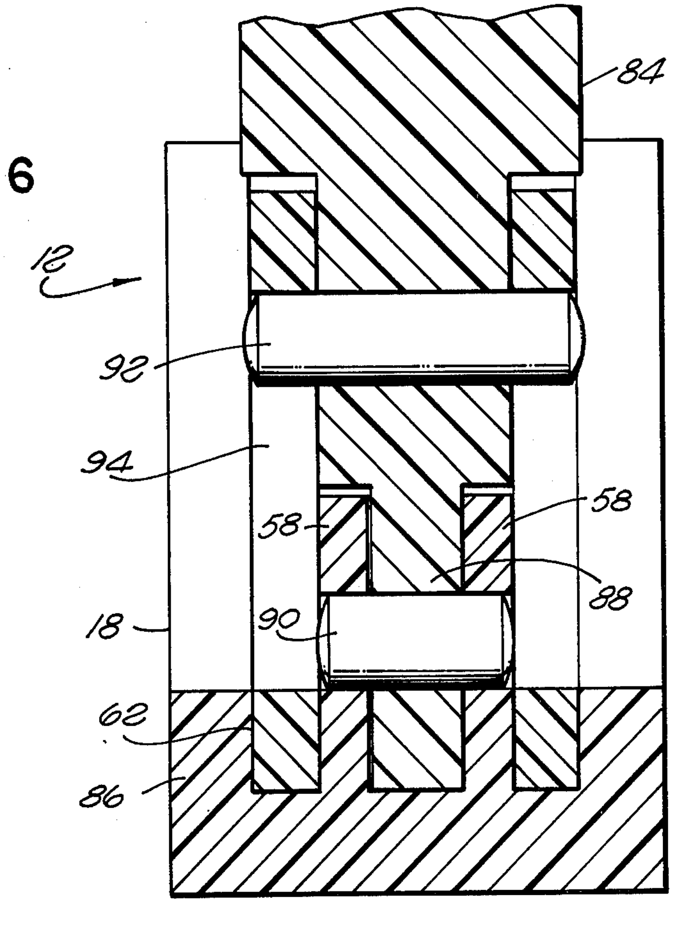
FIG. 6 is a vertical sectional view taken along line 6—6 of FIG. 3.
Figure 7:
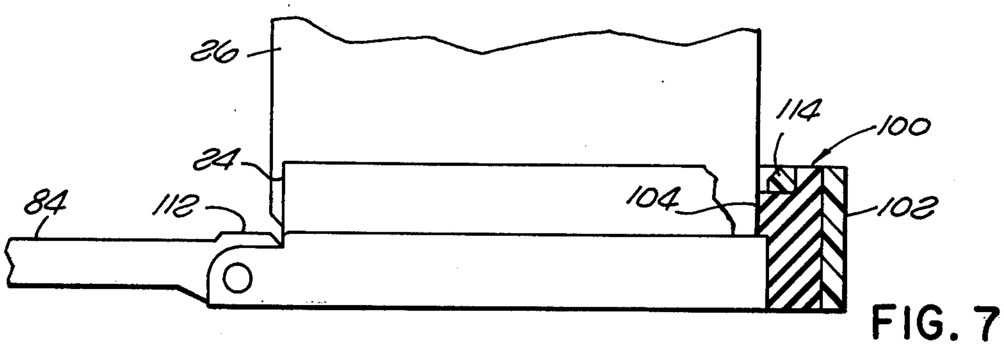
FIG. 7 is a somewhat schematic, longitudinal vertical sectional view of the connector of the present invention showing a printed circuit board abutting a resilient stop member in one end of the connector housing, and with the actuating handle shown in its lower position.

The cam actuator elements 64 are shifted longitudinally in the connector housing by means of an actuating handle 84 mounted on the end of the connector housing. The housing embodies an extension 86 extending outwardly from the end 24 thereof. As seen in FIG. 6, the slots 62 and inner walls 58 extend outwardly to the end of the extension 86. The handle has a narrow inner portion 88 which extends between the walls 58, and is pivotally mounted relative to the connector housing by means of a pin 90 extending through aligned holes in the walls 58 and inner portion 88 of the handle. A second pin 92 extends transversely through the handle above the pin 90. The ends of the pin 92 are slidable in vertical slots 94 in end portions 96 of the cam actuator elements 64.

Figure 5:
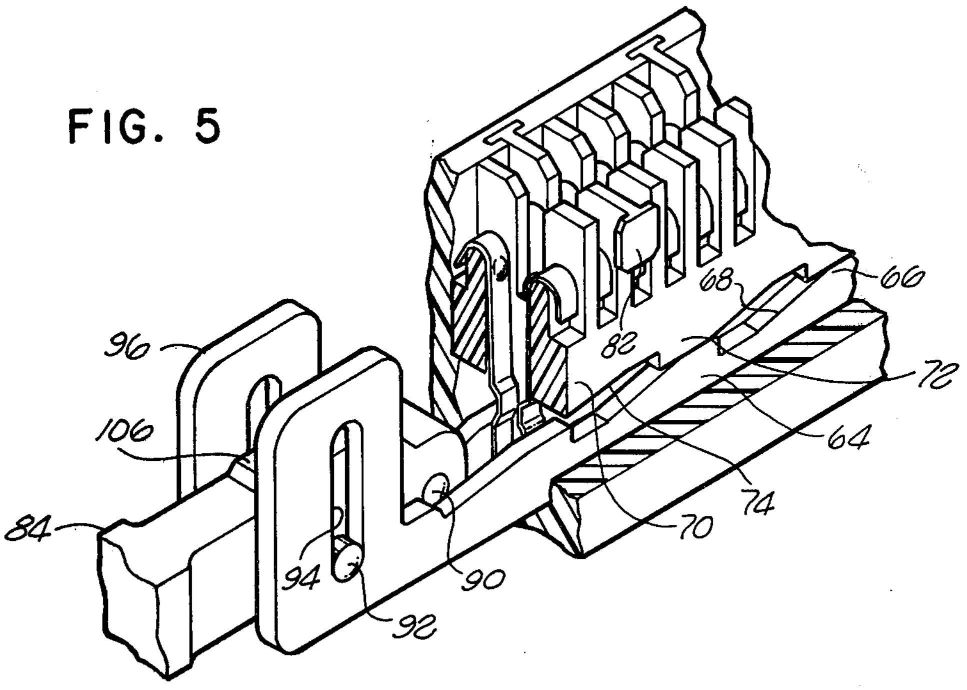
FIG. 5 is a perspective view similar to FIG. 3 but showing the actuating handle of the connector in its lower position wherein the contacts are open, as illustrated in FIG. 4.

When the actuating handle 84 is in its upper position as illustrated in FIGS. 3 and 6, the cam actuator elements 64 are located in the connector housing so that the cam shifting members 70 are in their lower position wherein the two rows of contacts 28 are in their normally closed, unactuated position. It will be appreciated that when the actuating handle is in such upper position, the handle blocks the end of the slot 20 in the connector housing to prevent insertion of the printed circuit board 26 into the housing while the contacts are in their closed position. A projection 98 is formed on the handle 84, as seen in FIG. 3, which extends inwardly over the connector housing in alignment with the slot 20 therein to form a second blocking element which will prevent insertion of the printed circuit board into the slot from the front or top of the housing. When it is desired to insert a printed circuit board into the housing, the actuating handle 84 is moved to its lower position as seen in FIGS. 1 and 5 which causes the cam actuator elements 64 to be shifted outwardly of the housing which in turn causes the contact shifting members 70 to move upwardly as seen in FIG. 4 to retract the contacting portions of the contacts away from the printed circuit board receiving slot 20 so that the board 26 may be inserted into the slot with zero insertion force. When the handle 84 is in its lower position, the board 26 may be inserted into the housing from either the front or end thereof. After the board 26 is inserted into the slot, the handle 84 is raised to its upper position which allows the contacts to spring inwardly toward their normally closed position whereby they engage the conductive traces on the sides of the printed circuit board. Also, the angular arms 52 on the contacts resiliently urge the contact shifting members 70 to their lower position shown in FIG. 2.

The connector 12 is assembled by first inserting the cam actuator elements 64 into the slots 62 from the top or the end 24 of the housing. Thereafter, the contact shifting members 70 are inserted into the housing above the elements 64. Then the contacts are inserted into the housing from the top until the upper mounting portions 30 of the contacts become frictionally engaged with the walls of the apertures 32 in the lower wall 34 of the housing. In this position, the arms 52 at the upper ends of the contacts extend over the upper portions 76 of the members 70 to retain the cam actuator elements and contact shifting members in the housing. Because the connector housing carries the contacts, the connector is what is known in the art as being a "discrete connector." The contacts may be press-fit into the plated-through holes 16 in the substrate 14 by first inserting the tails 38 of the contacts into the holes. Thereafter, a tool, not shown, is inserted through the slot 20 in the housing until it engages the upwardly facing shoulders 44 on the contacts. A downward pressure is applied to the tool which causes the lower mounting portions 36 of the contacts to become press-fit into the plated-through holes 16. Also, because the shoulders 42 on the contacts engage the shoulders 46 on the lower wall of the connector housing, the housing will be pressed down over the upper surface of the substrate 14. The press-fit between the lower mounting portions 36 of the contacts and the plated-through holes 16 is significantly greater than the retention force holding the contacts in the apertures 32 in the connector housing 18. To remove a contact, an upward force is applied to the lower end of the wire-wrap tail 38 in order to release the press-fit engagement between the lower mounting portion 36 of the contact and the plated-through hole 16 in the substrate. The contact is then pushed upwardly and lifted out of the top of the connector housing. A new contact may be inserted into the housing and pressed into the plated-through hole in the substrate by using a tool as described previously herein. It will, therefore, be appreciated that the contacts may be removed from the connector housing when it is mounted on the substrate without having to remove the housing from the substrate.

Figure 9:
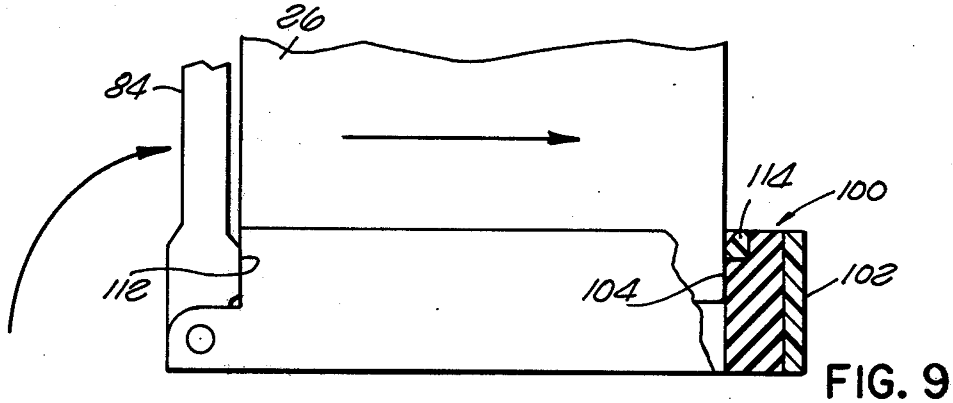
FIG. 9 is a somewhat schematic view similar to FIG. 7 showing the actuating handle in its upper position.
Figure 8:
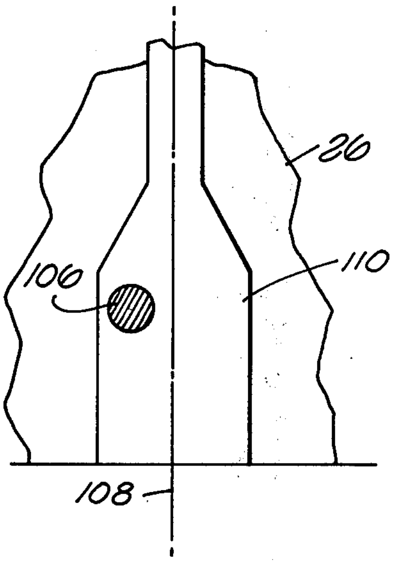
FIG. 8 is a fragmentary side elevational view of the printed circuit board shown in FIG. 7, showing the position of the contacting surface of one contact relative to a corresponding trace on the board.
Figure 10:
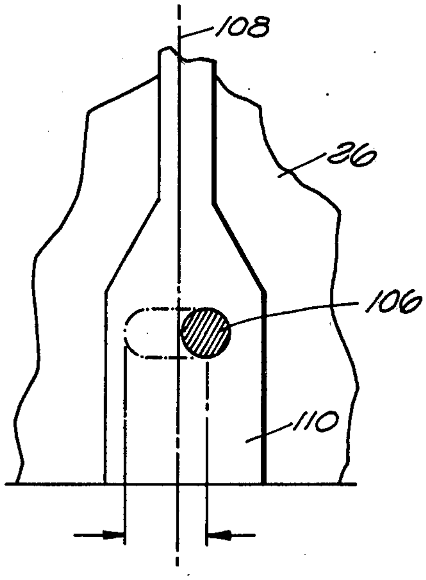
FIG. 10 is a fragmentary side elevational view similar to FIG. 8 showing how the position of the contacting surface of the contact relative to the trace on the board shifts longitudinally to provide a wiping action therebetween when the actuating handle is moved to its upper position shown in FIG. 9.

In order to provide a wiping action between the contacts and the traces on the printed circuit board 26, a resilient stop member 100 is mounted in the end 102 of the connector housing opposite to the extension 86. The stop member may be made of rubber, any other suitable elastomeric material, or it may be a spring. A projection 104 on the stop member extends a short distance into the end of the slot 20 so that it will be engaged by one end of the printed circuit board 26 when the latter is inserted into the slot. The stop positions the board so that the contacting surface on the protuberance 50 of each contact, indicated by the circular contact area 106 shown in FIG. 8, lies on one side of the centerline 108 of the corresponding conductive trace 110 on the board. The opposite end of the printed circuit board 26 remains extended a short distance beyond the end of the slot 20 in the connector housing. A cam 122 is formed on the upper surface of the actuating handle 84 closely adjacent to the end 24 of the housing. When the handle is shifted to its upper, contact closing position, the cam 112 on the handle forces the board 26 against the resilient stop 100, causing the stop to compress until the board engages a fixed stop 114 as seen in FIG. 9. Such longitudinal movement of the board in the slot 20 causes the contact area 106 to be shifted relative to the trace to the opposite side of the trace centerline 108 as illustrated in FIG. 10. Thus, the longitudinal sliding movement of the printed circuit board in the slot effected buy the actuation of the handle 84 produces a longitudinal wiping action between the protuberances 50 on the contacts 28 and the traces 110 on the printed circuit board. The fixed stop 114 on the housing adjacent to the resilient stop 100 precisely limits the extent of wiping action and, therefore, a controlled contact wiping action is achieved by the present invention. It will be appreciated that the aforementioned arrangement for effecting a wiping action is not limited to the specific printed circuit board connector disclosed herein, but may be utilized in any zero insertion force printed circuit board connector regardless of the mechanism utilized for actuating the contacts so long as means is provided for shifting the printed circuit board longitudinally in the slot against the resilient stop.

What is claimed is:

1. A zero insertion force electrical connector comprising:

an elongated insulative housing having a row of contacts therein, said housing having an opening to the top for receiving therein conductors on an electrical component;

each said contact having a mounting portion and a spring contacting portion extending upwardly from said mounting portion at an angle in one direction toward a vertical plane passing through said opening;

an arm on the spring contacting portion of each said contact extending downwardly at an angle in a direction away from said vertical plane;

means for retracting said contacting portions of said contacts away from said vertical plane, said retracting means comprising contact shifting means and cam actuator means;

said contact shifting means being disposed between said spring contacting portions and said arms of said contacts and movable vertically relative to said arms between a lower position and an upper position;

said contact shifting means embodying cam surface means slidably engaging the inside surfaces of said arms for retracting said contacting portions of said contacts away from said vertical plane when moved from said lower position to said upper position; and said cam actuator means being operable to move said contact shifting means from said lower position to said upper position.

2. An electrical connector as set forth in claim 1 wherein:

said contacting portion of each said contact embodies a reversely bent end portion providing said arm.

3. An electrical connector as set forth in claim 1 wherein:

said cam actuator means comprises an elongated element mounted for longitudinal sliding movement in said housing.

4. An electrical connector as set forth in claim 3 wherein:

said cam actuator means underlies said contact shifting means and embodies camming surfaces on its upper edge.

5. An electrical connector as set forth in claim 1 wherein:

the mounting portion of each said contact embodies an upwardly facing shoulder on the side of the contact opposite to said arm, said shoulder underlying said opening whereby a tool may be inserted through said opening to engage said shoulder for forcing said contact downwardly.

6. An electrical connector as set forth in claim 1 wherein:

said housing embodies a lower wall having a plurality of contact receiving apertures therein; and the mounting portions of said contacts are frictionally engaged in said apertures.

7. An electrical connector as set forth in claim 6 including:

an insulative substrate underlying said housing;

said substrate having a plurality of holes therein receiving said contacts;

said contacts having second mounting portions below said first-mentioned mounting portions press-fit into said holes, said contacts being mounted in said apertures in said lower wall by a retention force which is less than the retention force holding the contacts press-fit into said holes in said substrate.

8. An electrical connector as set forth in claim 7 wherein:

said first mounting portion of each said contact embodies an upwardly facing shoulder on the side of the contact opposite to said arm, said shoulder underlying said opening whereby a tool may be inserted through said opening to engage said shoulder for forcing said contact downwardly.

9. A zero insertion force electrical connector comprising:

an elongated insulative housing having two rows of contacts therein, said housing having an opening to the top between said rows of contacts for receiving therein conductors on an electrical component;

said contacts having mounting portions and spring contacting portions extending upwardly from said mounting portions toward a vertical plane passing through said opening;

arms on said contacting portions of said contacts extending downwardly at an angle away from said vertical plane;

means for retracting said contacting portions of said contacts away from said vertical plane;

said retracting means comprising a pair of contact shifting means and cam actuator means;

said contact shifting members extending lengthwise of said housing and being disposed on opposite sides of said rows of contacts below said arms, said contact shifting members being movable vertically relative to said arms between a lower portion and an upper portion;

said contact shifting members embodying cam surface means slidably engaging the inside surfaces of said arms for retracting said contacting portions of said contacts away from said vertical plane when moved from said lower position to said upper position; and said cam actuator means being operable to move said contact shifting members from said lower position to said upper position.

10. A zero insertion force electrical connector as set forth in claim 9 including:

upwardly facing shoulders on the opposed sides of said contacts of said two rows of contacts underlying said opening whereby a tool may be inserted through said opening to engage said shoulders for forcing said contacts downwardly.

11. A zero insertion force electrical connector as set forth in claim 9 wherein:

said contacts are removably mounted in said housing from the top of the housing.

12. A zero insertion force electrical connector as set forth in claim 9 wherein:

said cam actuator means comprises a pair of elongated elements underlying said contact shifting members and embodying camming surfaces on their upper edges.

13. A zero insertion force electrical connector as set forth in claim 12 wherein:

said elongated elements are mounted for longitudinal sliding movement in said housing.

14. A printed circuit board connector comprising:

an elongated insulative housing containing a row of contacts and having a printed circuit board receiving slot;

first means for effecting movement of said contacts to a closed position for engaging conductive traces on a printed circuit board inserted into said slot; and second means for effecting longitudinal movement of a printed circuit board in said slot upon movement of said contacts to produce a wiping action between said contacts and said traces.

15. A printed circuit board connector as set forth in claim 14 wherein:

said slot opens at one end of said housing; and said second means comprises a handle pivotally mounted at said one end of said housing and a resilient stop member mounted in the other end of said housing forming an end wall of said slot.

16. A printed circuit board connector as set forth in claim 14 wherein:

said second means comprises a resilient stop member at one end of said slot in said housing and pressure exerting means adjacent to the other end of said slot for forcing a printed circuit board in said slot against said stop member.

17. A printed circuit board connector as set forth in claim 16 wherein:

said first means operates in response to said pressure exerting means.

18. A printed circuit board connector as set forth in claim 15 wherein:

said handle embodies a cam for forcing a printed circuit board in said slot against said stop member when said handle is pivoted in one direction.

19. A printed circuit board connector as set forth in claim 15 wherein:

said first means includes said handle and cam actuator means coupled to said handle and longitudinally movable in said housing; and said cam actuator means effects movement of said contacts to said closed position upon pivoting of said handle in one direction.

20. A printed circuit board connector as set forth in claim 19 wherein:

said cam actuator means causes said contacts to be moved to an open position when said handle is pivoted in a direction opposite to said one direction.

21. A printed circuit board connector as set forth in claim 19 wherein:

said handle blocks said one end of said slot when said contacts are moved to said closed position.

* * * * *